(12) United States Patent
Son (10) Patent No.: US 7,777,406 B2
(45) Date of Patent: Aug. 17, 2010

(54) ORGANIC LIGHT EMITTING DIODE DISPLAY DEVICE

(75) Inventor: Jong-Hoon Son, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 334 days.

(21) Appl. No.: 12/073,674

(22) Filed: Mar. 7, 2008

(65) Prior Publication Data

US 2008/0218058 A1     Sep. 11, 2008

(30) Foreign Application Priority Data

Mar. 7, 2007     (KR)     ...................... 10-2007-0022554

(51) Int. Cl.
*H05B 33/22*     (2006.01)
*H05B 33/00*     (2006.01)

(52) U.S. Cl. ...................................... 313/503; 313/504

(58) Field of Classification Search .................. 313/503, 313/504

See application file for complete search history.

(56) References Cited

U.S. PATENT DOCUMENTS

| | | | | |
|---|---|---|---|---|
| 7,166,959 | B2 * | 1/2007 | Suzuki et al. | 313/504 |
| 7,502,083 | B2 * | 3/2009 | Oda et al. | 349/113 |
| 2003/0156239 | A1 * | 8/2003 | Inoue et al. | 349/113 |
| 2003/0234608 | A1 * | 12/2003 | Lee et al. | 313/504 |
| 2004/0241931 | A1 * | 12/2004 | Akimoto et al. | 438/220 |
| 2005/0230684 | A1 * | 10/2005 | Seo et al. | 257/72 |
| 2008/0020500 | A1 * | 1/2008 | Park et al. | 438/29 |

FOREIGN PATENT DOCUMENTS

| | | |
|---|---|---|
| JP | 10-308285 | 11/1998 |
| JP | 11-070610 | 3/1999 |
| KR | 10-2004-0000630 | 1/2004 |
| KR | 10-2006-0091648 | 8/2006 |
| KR | 10-2006-0117795 | 11/2006 |
| KR | 10-2006-0129058 | 12/2006 |

OTHER PUBLICATIONS

Korean Notice of Allowability issued by Korean Intellectual Property Office Jan. 31, 2008 in Applicant's corresponding Korean Patent Application No. 10-2007-0022554.

* cited by examiner

*Primary Examiner*—Nimeshkumar D. Patel
*Assistant Examiner*—Anthony T Perry
(74) *Attorney, Agent, or Firm*—Robert E. Bushnell, Esq.

(57) ABSTRACT

A passivation layer formed over and under a first pixel electrode is provided to prevent corrosion of the first pixel electrode of an organic light emitting diode (OLED) display device. The OLED display device includes: a substrate, a first passivation layer disposed on the substrate, a first pixel electrode disposed over the first passivation layer, a second passivation layer disposed over the first pixel electrode, a second pixel electrode disposed over the second passivation layer, an organic layer including an emission layer disposed over the second pixel electrode, and a counter electrode disposed over the organic layer. Each of the first and second passivation layers is formed of one selected from the group consisting of NiCr, $Al_2O_3$, $TiO_2$, ZnO and $PbO_2$.

20 Claims, 6 Drawing Sheets

ORGANIC LIGHT EMITTING DIODE DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 7 Mar. 2007 and there duly assigned Serial No. 10-2007-0022554.

BACKGROUND OF THE INVENTION

1. Field of the Invention

The present invention relates to an organic light emitting diode (OLED) display device, and more particularly, to an OLED display device having a passivation layer over and under a first pixel electrode to prevent corrosion of the first pixel electrode.

2. Description of the Related Art

Generally, in OLED display devices, electrons and holes are respectively injected into an emission layer from a cathode (an electron injection electrode) and an anode (a hole injection electrode) and then combined in the emission layer to create excitons, and when the electrons and holes transition from an excited state to a ground state, light is emitted. By such a principle, the OLED does not require a separate light source, which is required in a conventional thin film liquid crystal display device, so that its volume and weight can be reduced.

The OLED display device may be classified into a passive-matrix type and an active-matrix type depending on its driving mechanism. The passive-matrix OLED display device has a relatively simple configuration, and fabrication method does not require complicated processes, but the passive-matrix OLED display device has disadvantages in power consumption and size. Also, in the passive-matrix OLED display device, an aperture ratio is reduced as the number of interconnections is increased. Therefore, while a small display device employs the passive-matrix OLED, a large display device employs the active-matrix OLED.

Meanwhile, a common top-emission OLED display device employs a reflective electrode with excellent reflectivity at its one side, and the reflective electrode is formed of a conductive material having an appropriate work function in addition to the reflectivity. However, since there is no material having both characteristics so far, the reflective electrode is commonly fabricated in a multi-layered structure in which a reflective layer is separately formed, and an electrode material having a different conductivity is formed on the reflective layer.

Conventional art will now be described with reference to the accompanied drawings.

Figure 1A:
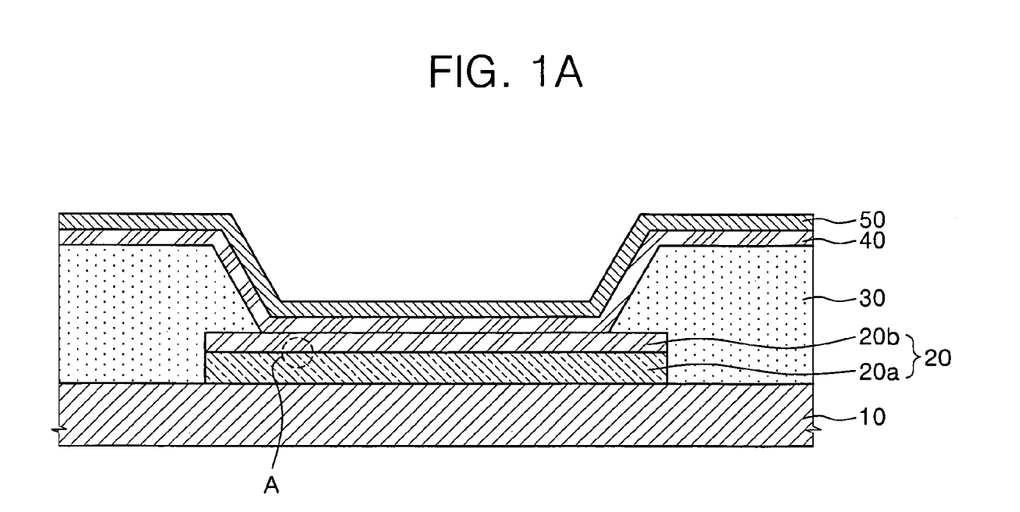
FIG. 1A is a cross-sectional view of an organic light emitting diode (OLED) display device.
Figure 1B:
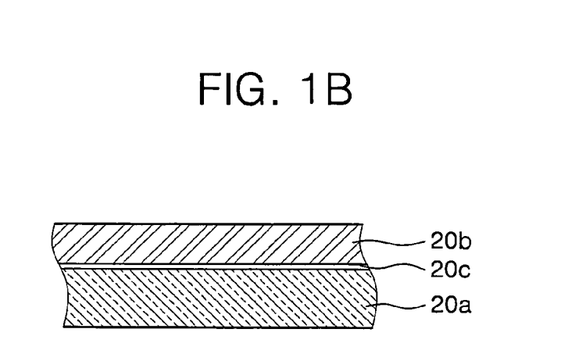
FIG. 1B is an enlarged cross-sectional view of part A of FIG. 1A, which illustrates that an oxide layer is formed at an interface between a reflective layer and a transparent electrode.
Figure 2:
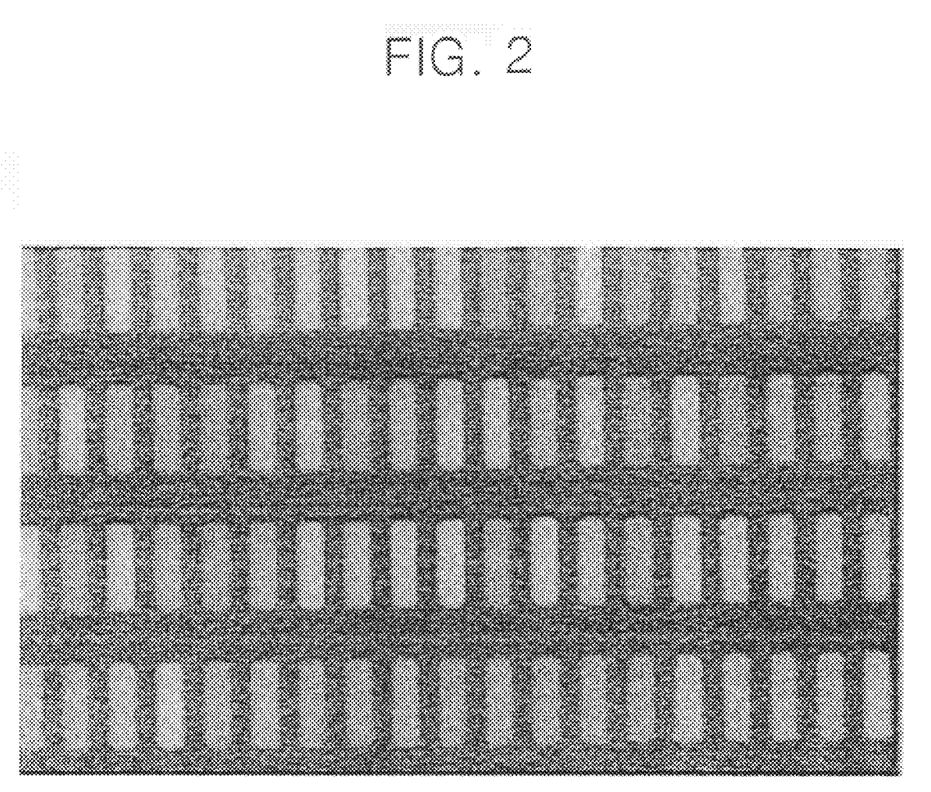
FIG. 2 illustrates non-uniformity of brightness in the OLED display device in which the oxide layers are formed in some pixels.

FIG. 1A is a cross-sectional view of a conventional OLED display device. FIG. 1B is an enlarged cross-sectional view of part A of FIG. 1A, which illustrates that an oxide layer is formed at an interface between a reflective layer and a transparent electrode layer. FIG. 2 illustrates non-uniformity of brightness in the conventional OLED display device.

Referring to FIG. 1A, the OLED display device has a structure in which a reflective layer 20a and a transparent electrode layer 20b, as a pixel electrode 20, are sequentially stacked on a substrate 10, and an organic layer 40 and a counter electrode 50 are sequentially stacked on the resultant structure.

In the OLED display device having such a structure, the reflective layer 20a is uniformly formed of a metallic material with excellent reflectivity on the substrate 10 by sputtering or vacuum evaporation. As the conventional reflective layer, an active metal such as aluminum (Al) or its alloy is used.

The transparent electrode layer 20b is formed by depositing a transparent electrode material on the reflective layer 20a such that light entering into the transparent electrode 20b is reflected by the reflective layer 20a, and then the transparent electrode 20b is formed into a pattern to form a plurality of pixel electrodes. Here, the transparent electrode material includes indium tin oxide (ITO) or indium zinc oxide (IZO).

A pixel defining layer 30 defining a pixel region is formed at both sides of the pixel electrode 20, and the organic layer 40 including an emission layer and the counter electrode 50 are formed on the pixel defining layer 30, and thus a top-emission OLED display device is completed.

In the manufacturing process of the OLED display device described above, the pixel electrode 20 is generally patterned by continuously performing photolithography and etching processes. Specifically, a photoresist pattern is formed on the transparent electrode layer 20b, and exposed and developed, and then the transparent electrode layer 20b and the reflective layer 20a are sequentially etched using the photoresist pattern as a mask.

Here, the etching process may be performed by a wet or dry etching technique, which is generally used. In the wet etching, a strong acid solution such as HF, $HNO_3$ or $H_2SO_4$ is applied or sprayed onto a region to be etched to obtain a desired pattern, and the above described strong acids, and other strong acidic and basic chemicals such as $HNO_3$, HCl, $H_3PO_4$, $H_2O_2$ and $NH_4OH$ are used in subsequent cleaning and stripping processes.

The strong acidic and basic chemicals used in the cleaning and stripping processes are in direct contact with the transparent electrode layer 20b and the reflective layer 20a used as the pixel electrodes 20, and thus a metal oxide layer 20c is created at an interface between the transparent electrode layer 20b and the reflective layer 20a as illustrated in FIG. 1B. Particularly, aluminum (Al) and its alloy easily corrode to form the metal oxide layer 20c even when exposed to the air.

Thus, the metal oxide layer 20c increases a sheet resistance of the transparent electrode layer 20b, and is diffused along the interface between the transparent electrode layer 20b and the reflective layer 20a, thereby abruptly increasing a contact resistance between the electrodes and showing very unstable resistance distribution.

Also, as shown in FIG. 2, the brightness of the pixels is not uniform. Colors of some pixels are bright, while those of other pixels are dark. This non-uniform brightness occurs during driving of the OLED display device due to the unstable resistance distribution, and thus the quality of the display significantly degenerates.

SUMMARY OF THE INVENTION

The present invention provides an organic light emitting diode (OLED) display device which prevents formation of a metal oxide layer at an interface between a transparent electrode material and a metal material, and therefore prevents decrease in brightness.

Also, the present invention provides an OLED display device having uniform brightness.

According to an aspect of the present invention, an organic light emitting diode (OLED) display device is provided, which comprises a substrate, a first passivation layer disposed on the substrate, a first pixel electrode disposed over the first passivation layer, a second passivation layer disposed over the first pixel electrode, a second pixel electrode disposed over the second passivation layer, an organic layer including an emission layer disposed over the second pixel electrode, and a counter electrode disposed over the organic layer. The emission layer emits light. Each of the first and second passivation layers is formed of one selected from the group consisting of NiCr, $Al_2O_3$, $TiO_2$, ZnO and $PbO_2$.

According to another aspect of the present invention, an OLED display device is provided, which comprises a substrate, a thin film transistor, which includes a semiconductor layer having a source and drain regions and a source and drain electrodes electrically connected to the semiconductor layer on the substrate, a first passivation layer connected to one of the source and drain electrodes, a first pixel electrode disposed over the first passivation layer, a second passivation layer disposed over the first pixel electrode, a second pixel electrode disposed over the second passivation layer, a pixel defining layer disposed over the second pixel electrode and having an opening partially exposing the second pixel electrode, an organic layer including an emission layer disposed on the second pixel electrode exposed through the opening, and a counter electrode disposed over the organic layer. Each of the first and second passivation layers is formed of one selected from the group consisting of NiCr, $Al_2O_3$, $TiO_2$, ZnO and $PbO_2$. The emission layer emits light.

Each of the first and second passivation layers may be formed to a thickness of 10 Å to 50 Å.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully hereinafter with reference to the accompanying drawings, in which exemplary embodiments of the invention are shown. In the drawings, the lengths and thicknesses of layers and regions are exaggerated for clarity. Like reference numerals are used to denote like elements throughout the specification.

Figure 3:
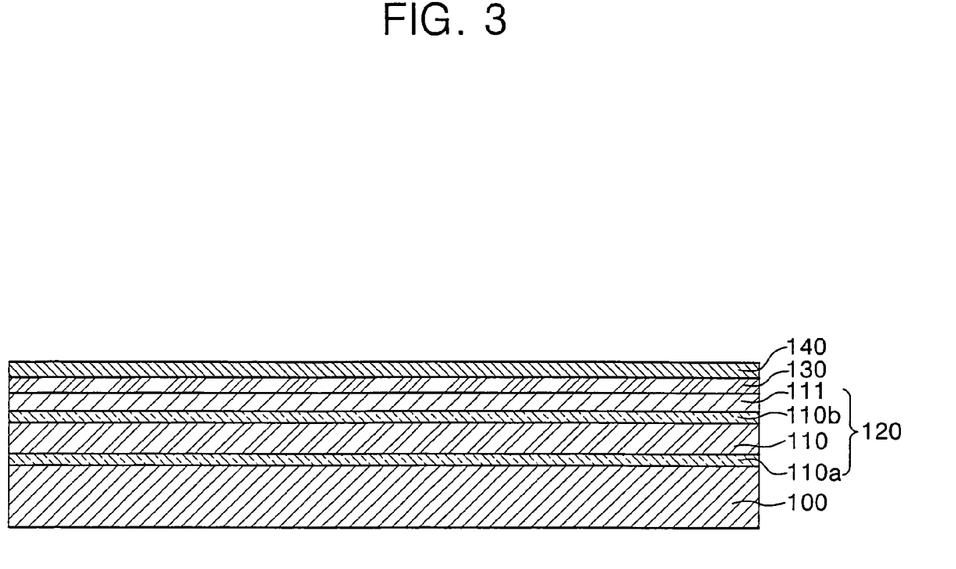
FIG. 3 is a cross-sectional view of an OLED display device according to a first exemplary embodiment of the present invention.

FIG. 3 is a cross-sectional view of an organic light emitting diode (OLED) display device according to a first exemplary embodiment of the present invention. Referring to FIG. 3, a first passivation layer 110a is formed on an insulating substrate 100. Here, the first passivation layer 110a may be formed of one selected from the group consisting of NiCr, $Al_2O_3$, $TiO_2$, ZnO and $PbO_2$.

Subsequently, a first pixel electrode 110 formed of a metallic material having excellent reflectivity is disposed over the first passivation layer 110a. Here, the first pixel electrode 110 may be formed of one selected from the group consisting of Al, an Al alloy, Ag and an Ag alloy, and formed to a thickness of 900 to 2000 Å. If the thickness is less than 900 Å, light is partially transmitted. 1000 Å is the minimum thickness that prevents the light transmission. Also, if the thickness is more than 2000 Å, it is not preferable in terms of production cost and time. The first pixel electrode 110 reflects the light to increase brightness and light efficiency.

A second passivation layer 110b is disposed on the first pixel electrode 110. Here, the second passivation layer 110b may be formed of one selected from the group consisting of NiCr, $Al_2O_3$, $TiO_2$, ZnO and $PbO_2$.

That is, the first pixel electrode of the present invention is disposed over the first passivation layer and under the second passivation layer, and the material forming the first and second passivation layers, such as NiCr, $Al_2O_3$, $TiO_2$, ZnO or $PbO_2$ prevents oxidation of the first pixel electrode 110 by being first oxidized during the etching or cleaning process of the pixel electrode.

Here, each of the first and second passivation layers 110a and 110b may be formed to a thickness of 10 Å or more, and preferably, 10 to 50 Å. If the first passivation layer 110a is formed to a thickness less than 10 Å, it has no effect on oxidation prevention of the first pixel electrode, and if the thickness is more than 50 Å, it has excellent effect on oxidation prevention, but poor effect on charge transfer from the first passivation layer to the first pixel electrode by tunneling effect. Also, if the thickness of the second passivation layer 110b is less than 10 Å, it has no effect on oxidation prevention of the first pixel electrode, and if the thickness is more than 50 Å, it has excellent effect on oxidation prevention, but poor effect on charge transfer from the second passivation layer to the second pixel electrode by tunneling effect and transmittance of the light reflected from the first pixel electrode is reduced.

Subsequently, a second pixel electrode 111 is formed on the second passivation layer 110b. The second pixel electrode 111 may be formed of one selected from the group consisting of ITO, IZO, tin oxide (TO) and zinc oxide (ZnO). Here, the second pixel electrode 111 is formed to a thickness of 50 to 100 Å. If the thickness of the second pixel electrode 111 is less than 50 Å, the uniformity of the thin film of the second pixel electrode 111 may decrease, and when the thickness is more than 100 Å, reflectivity is reduced by more than 10 to 15% in a blue light region due to interference effect.

Also, not illustrated in the drawing, a third pixel electrode may be further formed under the first passivation layer. The third pixel electrode may be formed of one selected from the group consisting of ITO, IZO, TO, and ZnO, and formed to a thickness of 50 to 100 Å. When the thickness of the third pixel electrode is less than 50 Å, uniformity decreases, and when the thickness is more than 100 Å, adherence weakens due to its own stress of the third pixel electrode.

A photoresist pattern is formed on the second pixel electrode 111, exposed, and developed. Then, the second pixel electrode, the second passivation layer, the first pixel electrode and the first passivation layer are etched using the photoresist pattern as a mask to form a pixel electrode 120.

Here, the etching process may be performed using a wet or dry etching technique which is generally used. A strong acid solution such as HF, $HNO_3$ and $H_2SO_4$ is applied or spayed onto a region to be wet etched so as to obtain a desired pattern, and then the strong acids described above and other acidic and basic chemicals such as $HNO_3$, HCl, $H_3PO_4$, $H_2O_2$ and $NH_3OH$ are used in subsequent cleaning and stripping processes.

However, in the present invention, even when the strong acidic and basic chemicals used in the etching, cleaning and stripping processes are in contact with the first pixel electrode 110, the first and second passivation layer 110a and 110b are first oxidized, and thus a metal oxide layer is not formed in the first pixel electrode.

Subsequently, an organic layer 130 including an emission layer is formed on the pixel electrode 120. Here, the organic layer 130 may be formed in several layers depending on its function, which is generally formed in a multi-layered structure including at least one of a hole injection layer, a hole transport layer, a hole blocking layer, an electron transport layer, and an electron injection layer in addition to an emission layer.

The emission layer is a self-emissive layer that emits light with a specific wavelength according to a recombination theory of electrons and holes, which are injected from a cathode and an anode of the OLED. At least one of a hole injection layer, a hole transport layer, a hole blocking layer, an electron transport layer and an electron injection layer which have charge transportability may be further included between each electrode and the emission layer to obtain high emission efficiency.

When the pixel electrode 120 of the OLED of the present invention serves as an anode, a counter electrode to be formed later serves as a cathode. The formation of an organic layer 130 including the emission layer is performed using a wet coating technique using a liquid-type material such as spin coating, deep coating, spraying, screen printing or ink-jet printing, or a dry coating technique such as sputtering or vacuum evaporation.

Subsequently, an OLED is formed by forming a counter electrode 140 on the organic layer 130. The counter electrode 140 is formed in a semi-transmissive cathode type, or in a stacked structure of a semi-transmissive cathode and a transmissive cathode. The semi-transmissive cathode electrode may be thinly formed to a thickness of 50 to 300 Å using one selected from the group consisting of Li, Ca, LiF/Ca, LiF/Al, Al, Mg and an Mg alloy. The counter electrode having a stacked structure is formed by stacking a semi-transmissive cathode using a metal with a small work function, which is one selected from the group consisting of Li, Ca, LiF/Ca, LiF/Al, Al, Mg and an Mg alloy, and a layer formed of one selected from the group consisting of ITO, IZO, TO and ZnO. Here, when the thickness of the semi-transmissive cathode is less than 50 Å, electrons are not injected at a low voltage, and when the thickness is more than 300 Å, transmittance is significantly reduced, which is not preferable. Also, the total thickness of the semi-transmissive cathode and the transmissive cathode is preferably 100 to 4000 Å.

Figure 4:
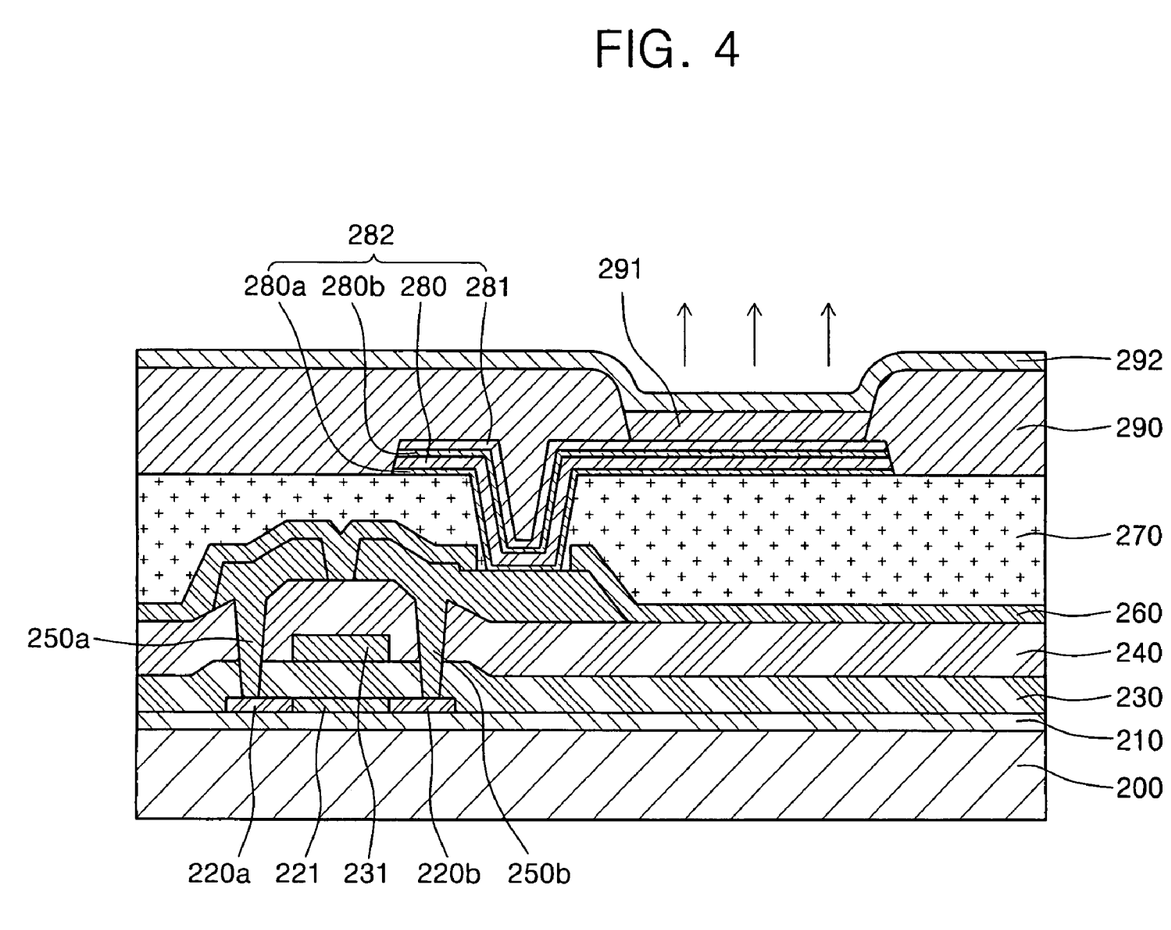
FIG. 4 is a cross-sectional view of an OLED display device according to a second exemplary embodiment of the present invention.

FIG. 4 is a cross-sectional view of an OLED display device according to a second exemplary embodiment of the present invention. Referring to FIG. 4, a buffer layer 210 with a predetermined thickness is formed of silicon dioxide by plasma-enhanced chemical vapor deposition (PECVD) on the entire surface of a transparent insulating substrate 200. Here, the buffer layer 210 prevents diffusion of impurities into the transparent insulating substrate 200 during a crystallization process of an amorphous silicon layer which is formed in a subsequent process.

A semiconductor layer, i.e., amorphous silicon (not illustrated) is deposited to a predetermined thickness over the buffer layer 210. The amorphous silicon layer is crystallized by excimer laser annealing (ELA), sequential lateral solidification (SLS), metal induced crystallization (MIC) or metal induced lateral crystallization (MILC), and then patterned by photolithography in order to form a semiconductor layer pattern in a unit pixel. The semiconductor pattern includes a source region 220a, a drain region 220b, and a channel region 221.

A gate insulating layer 230 is formed on the entire surface of the substrate including the semiconductor layer pattern. Here, the gate insulating layer 230 may be a silicon oxide ($SiO_2$) layer, a silicon nitride (SiNx) layer or a double layer thereof.

A gate electrode 231 is formed on a specific region, which corresponds to a channel region 221 of the semiconductor layer pattern, of the gate insulating layer 230. The gate electrode 231 may be formed of one selected from the group consisting of Al, an Al alloy, Mo and a Mo alloy.

Then, impurity ions are injected into the semiconductor layer pattern using the gate electrode 231 as an ion injection mask, so as to form source and drain regions 220a and 220b. Here, the ion injection process is performed using an n+ or p+ impurity as a dopant.

An interlayer insulating layer 240 is formed to a predetermined thickness on the entire surface of the resultant structure. Here, the interlayer insulating layer 240 may be a silicon oxide ($SiO_2$) layer, a silicon nitride (SiNx) layer or a double layer thereof.

The interlayer insulating layer 240 and the gate insulating layer 230 are etched by photolithography, so as to form a contact hole that exposes the source and drain regions 220a and 220b. Source and drain electrode materials are formed on the entire surface including the contact hole, and then etched by photolithography so as to form source and drain electrodes 250a and 250b in contact with the source and drain regions 220a and 220b. Here, in the formation of the source and drain electrodes 250 and 250b, the source and drain electrode materials are formed of a single layer of one selected from the group consisting of Mo, W, MoW, AlNd, Ti, Al, an Al alloy, Ag and an Ag alloy, or at least a double layer including low-resistance materials such as Mo, Al or Ag to reduce an interconnection resistance, that is, one selected from the group consisting of Mo/Al/Mo; MoW/AlNd/MoW, Ti/Al/Ti, Mo/Ag/Mo and Mo/Ag alloy/Mo. The semiconductor layer, the source and drain electrode, and the gate electrode form a thin film transistor.

An insulating layer is disposed on the source and drain electrodes 250a and 250b. The insulating layer may include a first insulating layer 260, which can be made of an inorganic material, and a second insulating layer 270, which can be made of an organic material. One of the first and second insulating layers can be formed, or both of them can be formed as shown in FIG. 4. Also, a first passivation layer 280a is connected to one of the source and drain electrodes through a via hole in the insulating layer. Here, the first passivation layer 280a may be formed of one selected from the group consisting of NiCr, $Al_2O_3$, $TiO_2$, ZnO and $PbO_2$.

A first pixel electrode 280 formed of a metal with an excellent reflectivity is disposed over on first passivation layer 280a. Here, the first pixel electrode 280 may be formed of one selected from the group consisting of Al, an Al alloy, Ag and an Ag alloy, and the first pixel electrode 280 may be formed to a thickness of 900 to 2000 Å. When the thickness of the first pixel electrode 280 is less than 900 Å, light is partially transmitted. 1000 Å is the minimum thickness at which the light is not transmitted. Also, the thickness of the first pixel electrode 280 is more than 2000 Å, which is not preferable in terms of production cost or processing time. The first pixel electrode 280 serves to reflect the light, thereby increasing brightness and light efficiency.

A second passivation layer 280b is disposed on the first pixel electrode 280. Here, the second passivation layer 280b may be formed of one selected from the group consisting of NiCr, $Al_2O_3$, $TiO_2$, ZnO and $PbO_2$. That is, the first pixel electrode of the present invention is disposed over the first passivation layer and under the second passivation layer. And, the materials forming the first and second passivation layers, such as NiCr, $Al_2O_3$, $TiO_2$, ZnO and $PbO_2$, are first oxidized during an etching or cleaning process of a pixel electrode, thereby preventing oxidation of the first pixel electrode 280.

Here, each of the first and second passivation layers 280a and 280b may be formed to a thickness of 10 Å or more, and preferably 10 to 50 Å. When the thickness of the first passivation layer 280a is less than 10 Å, it has no effect on prevention of the oxidation of the first pixel electrode, whereas when the thickness is more than 50 Å, it has excellent effect on oxidation prevention, but poor effect on charge transfer from the first passivation layer to the first pixel electrode by tunneling effect. Moreover, when the thickness of the second passivation layer 280b is less than 10 Å, it has no effect on prevention of oxidation of the first pixel electrode, whereas when the thickness is more than 50 Å, it has excellent effect on oxidation prevention, but poor effect on charge transfer from the second passivation layer to the second pixel electrode by tunneling effect, and transmittance of light reflected from the first pixel electrode is reduced.

Subsequently, a second pixel electrode 281 is formed on the second passivation layer 280b. The second pixel electrode 281 may be formed of one selected from the group consisting of ITO, IZO, TO and ZnO. Here, the second pixel electrode 281 is formed to a thickness of 50 to 100 Å. When the thickness of the second pixel electrode 281 is less than 50 Å, uniformity of the thin film may decrease, whereas when the thickness is more than 100 Å, the reflectivity in a blue light region is lowered more than 10 to 15% due to interference effect.

Also, while not illustrated in the drawing, a third pixel electrode may be further formed under the first passivation layer. The third pixel electrode may be formed of one selected from the group consisting of ITO, IZO, TO and ZnO, and here, the third pixel electrode is formed to a thickness of 50 to 100 Å. When the thickness of the third pixel electrode is less than 50 Å, uniformity of the layer decreases, whereas when the thickness is more than 100 Å, adhesion is weakened due to its own stress of the third pixel electrode.

A photoresist pattern is formed on the second pixel electrode 281, and common exposure and developing processes are performed on the photoresist pattern. The second pixel electrode, the second passivation layer, the first pixel electrode and the first passivation layer are then etched using the photoresist pattern as a mask, so as to form a pixel electrode 282.

Here, the etching process is performed using a common wet or dry etching technique. In wet etching, a strong acid solution such as HF, $HNO_3$, or $H_2SO_4$ is applied or sprayed onto a region to be etched in order to obtain a desired pattern, and the strong acids and other strong acidic or basic chemicals such as $HNO_3$, HCl, $H_3PO_4$, $H_2O_2$ and $NH_4OH$ are used in cleaning and stripping processes after the etching process.

However, even when the strong acidic and basic chemicals used in the etching, cleaning and stripping processes are in contact with the first pixel electrode 280, since the first and second passivation layers are first oxidized, a metal oxide layer is not formed in the first pixel electrode.

Subsequently, a pixel defining layer 290 including an opening partially exposing the pixel electrode is formed on the pixel electrode 282 so as to define an emission region of the OLED.

After forming the pixel defining layer 290, an organic layer 291 including an emission layer is formed on the entire surface of the insulating substrate 200 including the pixel electrode 282. Here, the organic layer 291 may be formed in several layers according to the function, and it is generally formed in a multi-layered structure including at least one layer of a hole injection layer, a hole transport layer, a hole blocking layer, an electron transport layer and an electron injection layer in addition to the emission layer.

The emission layer is a self-emissive layer that emits light with a specific wavelength according to a recombination theory of electrons and holes injected from a cathode and an anode of the OLED. At least one of a hole injection layer, a hole transport layer, a hole blocking layer, an electron transport layer and an electron injection layer which have charge transportability may be further included between each electrode and the emission layer to obtain high emission efficiency. If the pixel electrode 282 of the OLED of the present invention functions as an anode, a counter electrode to be formed later functions as a cathode. The formation of the organic layer 291 including the emission layer is performed by a wet coating technique using a liquid-type material such as spin coating, deep coating, spraying, screen printing or inkjet printing, or a dry coating technique such as sputtering or vacuum evaporation.

A counter electrode 292 is formed on the organic layer 291, and thus an OLED is completed. Here, the counter electrode 292 is formed in a semi-transmissive cathode type, or in a stacked structure of a semi-transmissive cathode type and a transmissive cathode type. The semi-transmissive cathode electrode may be thinly formed to a thickness of 50 to 300 Å using one selected from the group consisting of Li, Ca, LiF/Ca, LiF/Al, Al, Mg and an Mg alloy. The counter electrode having a stacked structure is formed by stacking a semi-transmissive cathode formed of a metal with a small work function which is one selected from the group consisting of Li, Ca, LiF/Ca, LiF/Al, Al, Mg and an Mg alloy, and a layer formed of one selected from the group consisting of ITO, IZO, TO and ZnO. Here, when the thickness of the semi-transmissive cathode is less than 50 Å, electrons are not injected at a low voltage, whereas, when the thickness is more than 300 Å, transmittance is significantly reduced, which is not preferable. Also, the total thickness of the semi-transmissive cathode and the transmissive cathode is preferably 100 to 4000 Å.

Figure 5:
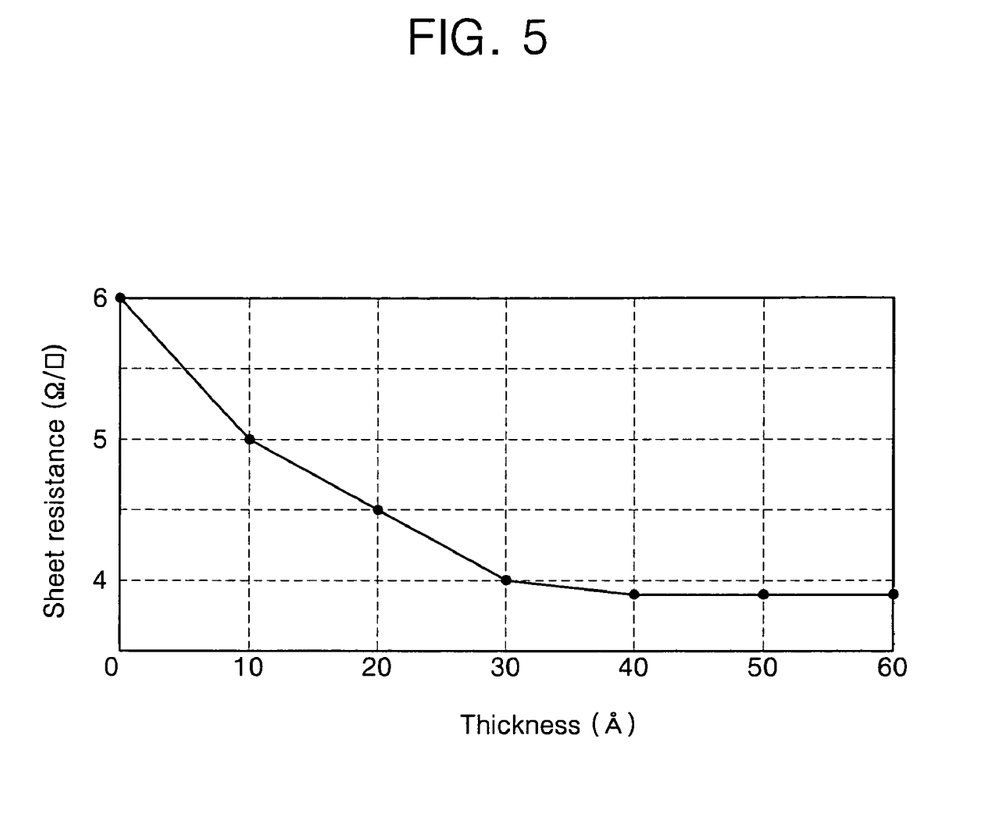
FIG. 5 illustrates a sheet resistance of a first pixel electrode depending on thicknesses of first and second passivation layers of the present invention.

FIG. 5 is a graph illustrating a sheet resistance of the first pixel electrode depending on the thickness of the first and second passivation layers of the present invention.

As shown in FIG. 5, when the thickness of each of the first and second passivation layers is 0 Å, that is, the passivation layers are not formed under and over the first pixel electrode, the sheet resistance of the first pixel electrode is 6 Ω/sq, when the thickness of each of the first and second passivation layers is 10 Å, the sheet resistances of the first pixel electrode is reduced to 5 Ω/sq, and when the thickness of each is more than 30 Å, the sheet resistance is reduced to 4 Ω/sq or less. That is, it is shown that the sheet resistance of the first pixel electrode is reduced, as the thickness of the first and second passivation layers increases.

Thus, each of the first and second passivation layers may have a thickness of 10 Å or more, but, as described above, if the thickness of the first passivation layer is more than 50 Å, it has poor effect on charge transfer from a first passivation layer to a first pixel electrode by tunneling effect, and when the thickness of the second passivation layer is more than 50 Å, it has poor effect on charge transfer from a second passivation layer to a second pixel electrode by the tunneling effect and transmittance of the light reflected from the first pixel electrode is reduced, and thus, the thickness of each of the first and second passivation layers of the present invention is preferably 10 to 50 Å.

Figure 6:
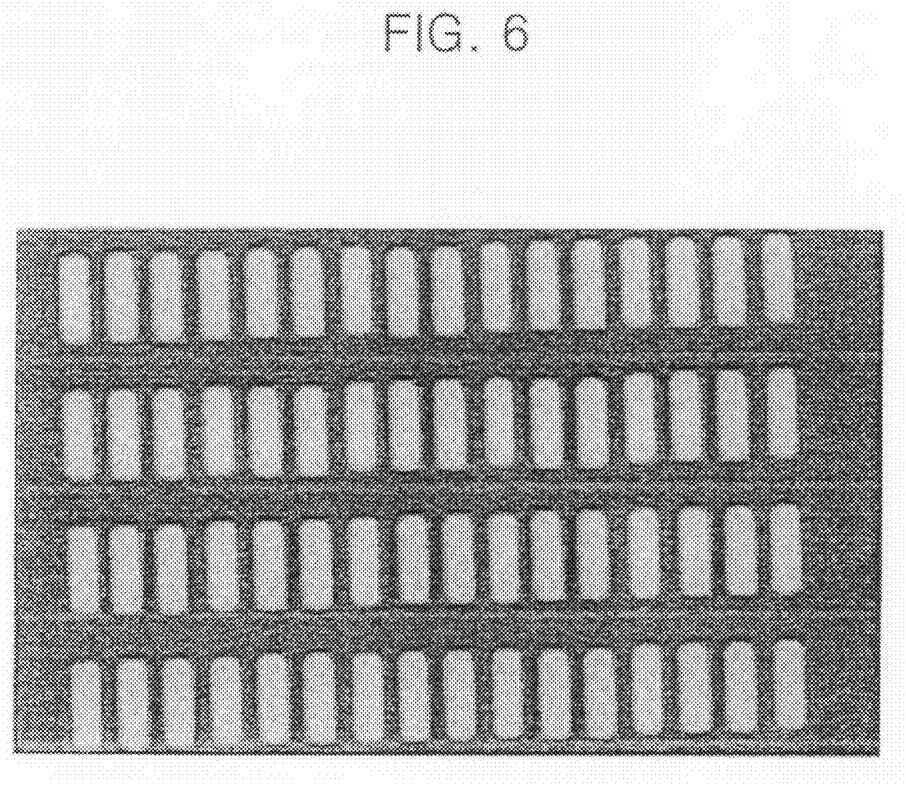
FIG. 6 illustrates brightness uniformity of an OLED display device according to the present invention.

FIG. 6 illustrates uniform brightness of an OLED display device constructed according to the structure of the present invention. As shown in FIG. 6, the OLED display device may be formed to implement high quality images having uniform brightness in pixels by preventing oxidation of the first pixel electrode.

According to the present invention as described above, the invention provides an OLED display device which can prevent deterioration in brightness by preventing oxidation of a first pixel electrode and creation of a metal oxide layer at an interface between a first pixel electrode and a second pixel electrode. Also, the present invention provides an OLED display device which can realize high quality images having uniform brightness between pixels.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting diode (OLED) display device, comprising:
    a substrate;
    a first passivation layer disposed on the substrate;
    a first pixel electrode disposed over the first passivation layer;
    a second passivation layer disposed over the first pixel electrode;
    a second pixel electrode disposed over the second passivation layer;
    an organic layer including an emission layer disposed over the second pixel electrode, the emission layer emitting light; and
    a counter electrode disposed over the organic layer, wherein each of the first and second passivation layers is formed of one selected from the group consisting of NiCr, $Al_2O_3$, $TiO_2$, ZnO and $PbO_2$.

2. The OLED display device according to claim 1, wherein the first pixel electrode is formed of one selected from the group consisting of Al, an Al alloy, Ag and an Ag alloy.

3. The OLED display device according to claim 1, wherein the second pixel electrode is formed of one selected from the group consisting of indium tin oxide (ITO), indium zinc oxide (IZO), tin oxide (TO) and zinc oxide (ZnO).

4. The OLED display device according to claim 1, further comprising:
    a third pixel electrode disposed between the first passivation layer and the substrate, the third pixel electrode being formed of one selected from the group consisting of ITO, IZO, TO and ZnO.

5. The OLED display device according to claim 4, wherein the thickness of the third pixel electrode is about 50 Å to 100 Å.

6. The OLED display device according to claim 1, wherein the counter electrode is formed of one selected from the group consisting of Li, Ca, LiF/Ca, LiF/Al, Al, Mg and an Mg alloy, or formed in a stacked structure of one selected from the group consisting of Li, Ca, LiF/Ca, LiF/Al, Al, Mg and an Mg alloy and one selected from the group consisting of ITO, IZO, TO and ZnO.

7. The OLED display device according to claim 6, wherein the counter electrode formed of the one selected from the group consisting of Li, Ca, LiF/Ca, LiF/Al, Al, Mg and an Mg alloy has a thickness of about 50 Å to 300 Å.

8. The OLED display device according to claim 1, wherein each of the first and second passivation layers is formed to a thickness of about 10 Å to 50 Å.

9. The OLED display device according to claim 1, wherein the thickness of the first pixel electrode is about 900 Å to 2000 Å.

10. The OLED display device according to claim 1, wherein the thickness of the second pixel electrode is about 50 Å to 100 Å.

11. An organic light emitting diode (OLED) display device, comprising:
    a substrate;
    a thin film transistor comprising:
        a semiconductor layer having a source and a drain regions;
        a source electrode electrically connected to the source region; and
        a drain electrode electrically connected to the drain region;
    a first passivation layer connected to one of the source and drain electrodes;
    a first pixel electrode disposed over the first passivation layer;
    a second passivation layer disposed over the first pixel electrode, each of the first and second passivation layers being formed of one selected from the group consisting of NiCr, $Al_2O_3$, $TiO_2$, ZnO and $PbO_2$;
    a second pixel electrode disposed over the second passivation layer;
    a pixel defining layer disposed over the second pixel electrode, the pixel defining layer having an opening partially exposing the second pixel electrode;
    an organic layer including an emission layer disposed on the second pixel electrode exposed through the opening, the emission layer emitting light; and
    a counter electrode disposed over the organic layer.

12. The OLED display device according to claim 11, wherein the first pixel electrode is formed of one selected from the group consisting of Al, an Al alloy, Ag and an Ag alloy.

13. The OLED display device according to claim 11, wherein the second pixel electrode is formed of one selected from the group consisting of ITO, IZO, TO and ZnO.

14. The OLED display device according to claim 11, further comprising:
    a third pixel electrode disposed between the first passivation layer and the substrate, the third pixel electrode being formed of one selected from the group consisting of ITO, IZO, TO and ZnO.

15. The OLED display device according to claim 14, wherein the thickness of the third pixel electrode is about 50 Å to 100 Å.

16. The OLED display device according to claim 11, wherein the counter electrode is formed of one selected from the group consisting of Li, Ca, LiF/Ca, LiF/Al, Al, Mg and an Mg alloy, or formed in a stacked structure of one selected from the group consisting of Li, Ca, LiF/Ca, LiF/Al; Al, Mg and an Mg alloy and one selected from the group consisting of ITO, IZO, TO and ZnO.

17. The OLED display device according to claim 16, wherein the counter electrode being formed of the one selected from the group consisting of Li, Ca, LiF/Ca, LiF/Al, Al, Mg and an Mg alloy has a thickness of about 50 Å to 300 Å.

18. The OLED display device according to claim 11, wherein each of the first and second passivation layers is formed to a thickness of about 10 Å to 50 Å.

19. The OLED display device according to claim 11, wherein the thickness of the first pixel electrode is about 900 Å to 2000 Å.

20. The OLED display device according to claim 11, wherein the thickness of the second pixel electrode is about 50 Å to 100 Å.

* * * * *